United States Patent
Izumi et al.

(10) Patent No.: US 11,143,706 B2
(45) Date of Patent: *Oct. 12, 2021

(54) BATTERY CAPACITY ESTIMATION METHOD AND BATTERY CAPACITY ESTIMATION DEVICE

(71) Applicant: TOYOTA JIDOSHA KABUSHIKI KAISHA, Toyota (JP)

(72) Inventors: Junta Izumi, Nagoya (JP); Masahiko Mitsui, Toyota (JP); Juni Yasoshima, Toyota (JP)

(73) Assignee: TOYOTA JIDOSHA KABUSHIKI KAISHA, Toyota (JP)

(*) Notice: Subject to any disclaimer, the term of this patent is extended or adjusted under 35 U.S.C. 154(b) by 50 days.

This patent is subject to a terminal disclaimer.

(21) Appl. No.: 16/718,829

(22) Filed: Dec. 18, 2019

(65) Prior Publication Data

US 2020/0200826 A1 Jun. 25, 2020

(30) Foreign Application Priority Data

Dec. 20, 2018 (JP) .............................. JP2018-238387

(51) Int. Cl.
| | |
|---|---|
| *G01R 31/367* | (2019.01) |
| *G01R 31/387* | (2019.01) |
| *G01R 31/36* | (2020.01) |
| *G06N 3/04* | (2006.01) |
| *B60R 16/033* | (2006.01) |
| *G01R 31/389* | (2019.01) |

(52) U.S. Cl.
CPC ......... *G01R 31/367* (2019.01); *G01R 31/387* (2019.01); *G06N 3/04* (2013.01); *B60R 16/033* (2013.01); *G01R 31/389* (2019.01); *G06N 3/0454* (2013.01)

(58) Field of Classification Search
CPC .. G01R 31/367; G01R 31/387; G01R 31/389; G06N 3/04; G06N 3/0454; B60R 16/033
USPC ............................................. 702/63; 320/162
See application file for complete search history.

(56) References Cited

U.S. PATENT DOCUMENTS

| | | | | |
|---|---|---|---|---|
| 2007/0090843 | A1* | 4/2007 | De Doncker | ........ G01R 31/389 324/426 |
| 2012/0316815 | A1* | 12/2012 | Morigaki | ............. G01R 31/392 702/63 |
| 2015/0276889 | A1* | 10/2015 | Osaka | .................. G01R 31/389 324/430 |
| 2016/0126590 | A1* | 5/2016 | Roberts | ............. H01M 10/0569 429/112 |

(Continued)

FOREIGN PATENT DOCUMENTS

| | | |
|---|---|---|
| JP | 2003-317810 A | 11/2003 |
| JP | 2018-146441 A | 9/2018 |

(Continued)

*Primary Examiner* — Ly D Pham
(74) *Attorney, Agent, or Firm* — Sughrue Mion, PLLC

(57) ABSTRACT

A battery capacity estimation method includes a first step and a second step. The first step is a step of obtaining image data of a Nyquist diagram drawn by a predetermined method, based on a Nyquist plot obtained by a predetermined AC-IR measurement. The second step is a step of obtaining a battery capacity estimate value of a battery to be measured by inputting the image data of the Nyquist diagram obtained in the first step into an input layer of a pre-trained neural network model.

10 Claims, 6 Drawing Sheets

(56) References Cited

U.S. PATENT DOCUMENTS

| | | | |
|---|---|---|---|
| 2016/0195577 A1* | 7/2016 | Osaka | G01N 27/28 |
| | | | 204/407 |
| 2019/0036373 A1* | 1/2019 | Shimura | H01M 10/48 |
| 2019/0331738 A1* | 10/2019 | Kodama | G01R 31/396 |
| 2020/0033414 A1 | 1/2020 | Izumi et al. | |
| 2020/0041570 A1 | 2/2020 | Izumi et al. | |
| 2020/0200825 A1* | 6/2020 | Izumi | G06N 3/08 |

FOREIGN PATENT DOCUMENTS

| | | |
|---|---|---|
| JP | 202020604 A | 2/2020 |
| JP | 202021592 A | 2/2020 |

* cited by examiner

BATTERY CAPACITY ESTIMATION METHOD AND BATTERY CAPACITY ESTIMATION DEVICE

CROSS REFERENCE TO RELATED APPLICATIONS

The present application claims priority from Japanese Patent Application No. 2018-238387 filed on Dec. 20, 2018, which is incorporated by reference herein in its entirety.

BACKGROUND

The present disclosure relates to a battery capacity estimation method and a battery capacity estimation device.

JP 2003-317810 A discloses a method of estimating battery characteristics. The method of estimating battery characteristics disclosed in the publication involves determining the presence or absence of micro-short circuit in a secondary battery based on a reaction resistance value of the secondary battery that is acquired by an alternating current impedance measurement method.

SUMMARY

The present inventors have been investigating a method for accurately and efficiently estimating a battery capacity of a secondary battery using an alternating current impedance measurement method.

Embodiments of a battery capacity estimation method disclosed herein includes a first step and a second step. The first step is a step of obtaining image data of a Nyquist diagram drawn by a predetermined method, based on a Nyquist plot obtained by a predetermined AC-IR measurement. The second step is a step of obtaining a battery capacity estimate value of a battery to be measured by inputting the image data of the Nyquist diagram obtained in the first step into a pre-trained neural network model.

The neural network model includes an input layer, an intermediate layer, and an output layer. The input layer is configured to receive the image data of the Nyquist diagram of the battery to be measured. The intermediate layer is configured to obtain a battery capacity estimate value according to the image data that are input to the input layer. The output layer is configured to output the battery capacity estimate value obtained by the intermediate layer.

In an embodiment of the battery capacity estimation method, the Nyquist diagram in the image data contained in the training data may be drawn to be sufficiently wide to contain the tolerance of the Nyquist plot obtained by the AC-IR measurement.

In this case, the Nyquist diagram in the image data contained in the training data may be drawn to have a width less than or equal to two times the tolerance of the Nyquist plot.

It is also possible that the Nyquist diagram in the image data obtained in the first step may be drawn to be sufficiently wide to contain the tolerance of the Nyquist plot obtained by the AC-IR measurement.

It is also possible that the Nyquist diagram in the image data obtained in the first step may be drawn to have a width less than or equal to two times the tolerance of the Nyquist plot obtained by the AC-IR measurement.

Embodiments of a battery capacity estimation device disclosed herein includes an input layer, an intermediate layer, and an output layer. The input layer may be configured to receive image data of a Nyquist diagram of a battery to be measured. The intermediate layer may be configured to obtain a battery capacity estimate value by performing a computation based on a weighting factor of a pre-trained neural network model based on the image data input to the input layer. The output layer may be configured to output the battery capacity estimate value obtained by the intermediate layer.

According to embodiments of the battery capacity estimation method and the battery capacity estimation device, image data of the Nyquist diagram obtained by an AC-IR measurement are input to a pre-trained neural network model, to obtain a battery capacity estimate value. In the Nyquist diagram, the plot points of the Nyquist plot obtained by the AC-IR measurement are interpolated. For this reason, the battery capacity can be estimated efficiently and accurately.

The Nyquist diagram in the image data contained in the training data may be drawn to be sufficiently wide to contain the tolerance of the Nyquist plot obtained by the AC-IR measurement. Alternatively, the Nyquist diagram may have a width within a range of 10% of the tolerance of the Nyquist plot.

In an embodiment of the battery capacity estimation method and the battery capacity estimation device disclosed herein, the intermediate layer may include a plurality of artificial neurons, for example. Each of the artificial neurons may include at least one weighting factor indicating a strength of a connection between artificial neurons, and the intermediate layer may be configured to perform a computation based on the weighting factor to obtain a battery capacity estimate value from the image data of the Nyquist diagram that are input to the input layer of the neural network model. Here, the weighting factor may be determined by, for the battery to be measured, learning training data including the image data of the Nyquist diagram drawn by the predetermined method based on the Nyquist plot obtained by the AC-IR measurement and an assessment value of battery capacity obtained when the image data of the Nyquist diagram have been obtained, the image data of the Nyquist diagram and the assessment value of battery capacity being associated with each other.

DETAILED DESCRIPTION

Hereinbelow, embodiments of a battery capacity estimation method and a battery capacity estimation device according to the present disclosure will be described in detail. It should be noted, however, that the embodiments described herein are, of course, not intended to limit the present invention. The present invention is not limited to the embodiments described herein unless specifically stated otherwise.

The embodiments of the battery capacity estimation method and the battery capacity estimation device use a Nyquist plot and a Nyquist diagram as the measurement results obtained by an AC-IR measurement, in order to estimate a battery capacity. Herein, the AC-IR measurement, the Nyquist plot, and the Nyquist diagram will be described first.

AC-IR Measurement

In the AC-IR measurement, an alternating current impedance in the battery is measured while varying the frequency within a predetermined frequency range. For example, alternating current signals at a plurality of frequencies within a range of 1 MHz to 100 mHz are successively applied across the electrodes of a secondary battery. Each time an alternating current signal of a corresponding frequency is applied, a response signal is measured. A real component and an imaginary component of impedance are calculated for each combination of the applied alternating current signal and the response signal, and they are plotted respectively on the horizontal axis and the vertical axis of a two-dimensional coordinate. Accordingly, the measurement values of the AC-IR measurement are obtained as a Nyquist plot. The AC-IR measurement is also referred to as an alternating current impedance measurement.

Measurement Device 60

Figure 1:
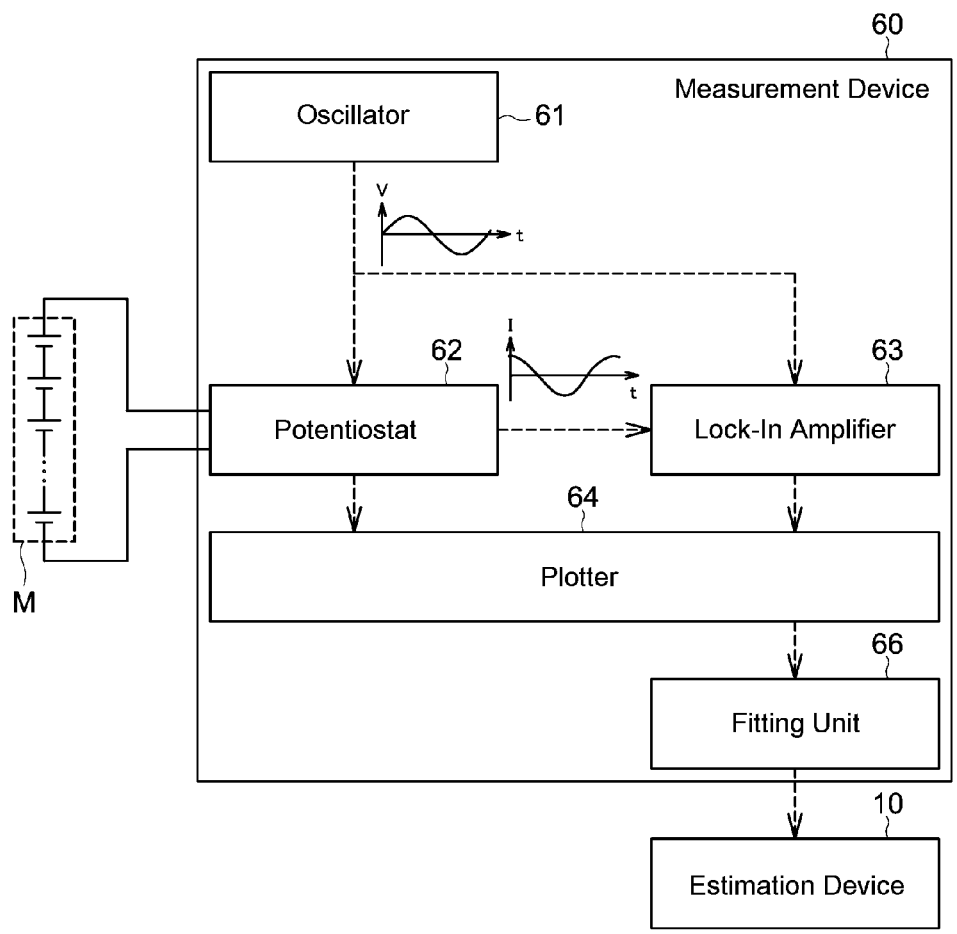
FIG. 1 is a schematic view illustrating an example of a measurement device 60 that performs an AC-IR measurement.

FIG. 1 is a schematic view illustrating an example of a measurement device 60 that performs an AC-IR measurement.

The measurement device 60 includes an oscillator 61, a potentiostat 62, a lock-in amplifier 63, a plotter 64, and a fitting unit 66. Although not shown in the drawings, the measurement device 60 may include, for example, a controller (for example, a processor such as a CPU), a memory, and input/output ports.

Various components of the measurement device 60, such as the fitting unit 66, may be embodied by cooperative combinations of hardware configurations of the measurement device 60 with software that are programmed to achieve predetermined functions. The measurement device 60 may be configured as a single device, as illustrated in FIG. 1. Alternatively, the measurement device 60 may be configured as an apparatus including a plurality of devices that function cooperatively.

Referring to FIG. 1, the module M is a secondary battery module that is to be measured. Although the secondary battery module is illustrated herein as a battery pack, the secondary battery that is to be measured may also be a single battery cell.

The oscillator 61 is a device that outputs sine waves of the same phase to the potentiostat 62 and the lock-in amplifier 63.

The potentiostat 62 generates alternating current application signals, and applies the generated application signals to the module M. In the present embodiment, the potentiostat 62 generates an alternating current application signal by superposing a predetermined direct current voltage on an alternating current voltage (for example, a voltage with an amplitude of about 10 mV) that is in the same phase as that of the sine wave output from the oscillator 61. Another feature of the potentiostat 62 is to detect electric current passing through the module M. The potentiostat 62 outputs, as a response signal from the module M, the detection result of the current to the lock-in amplifier 63. Still another feature of the potentiostat 62 is to output the application signal and the response signal to the plotter 64.

The lock-in amplifier 63 is a device that compares the phase of the sine wave that is output from the oscillator 61 and the phase of the response signal that is output from the potentiostat 62. In the present embodiment, the lock-in amplifier 63 outputs the result of the comparison (i.e., the phase difference between the sine wave and the response signal) to the plotter 64.

The plotter 64 is a device that plots the measurement results of the alternating current impedance of the module M onto a complex plane. In the present embodiment, the plotter 64 plots the measurement results of the alternating current impedance of the module M onto a complex plane based on the signals from the potentiostat 62 and the signals from the lock-in amplifier 63. Here, the signal from the potentiostat 62 indicates the amplitude ratio between the application signal and the response signal. The signal from the lock-in amplifier 63 indicates the phase difference between the application signal and the response signal.

In the measurement device 60 of the present embodiment, the frequency of the sine wave that is output from the oscillator 61 is swept over a predetermined frequency range. In response to this, the above-described processes by the potentiostat 62 and the lock-in amplifier 63 are executed repeatedly. Thereby, the measurement results of alternating current impedance of the module M that are acquired for various frequencies of the sine wave output from the oscillator 61 are plotted on a complex plane by the plotter 64. The resulting plot is referred to as a Nyquist plot. The Nyquist plot is also referred to as a Cole-Cole plot.

It should be noted that the configuration of the measurement device 60 is not limited to that illustrated in FIG. 1. For example, it is described that the potentiostat 62 of the present embodiment applies an alternating current voltage to the module M and detects the electric current passing through the module M while applying the voltage. However, it is also possible that the potentiostat 62 may detect a voltage response while applying an alternating current to the module M. It is also possible that the measurement device 60 may include a frequency response analyzer in place of the lock-in amplifier 63.

Furthermore, it is also possible to modify the technique of the alternating current impedance measurement. For example, it is also possible that the measurement device 60 may generate an application signal containing various frequency components within a predetermined frequency range (either one of voltage signal or current signal) and it may detect the response signal (the other one of voltage signal or current signal) while applying the application signal. It is also possible that the measurement device 60 may calculate an alternating current impedance for each of the frequencies by performing a fast Fourier transform on each of the application signal and the response signal.

Nyquist Plot Np

Figure 2:
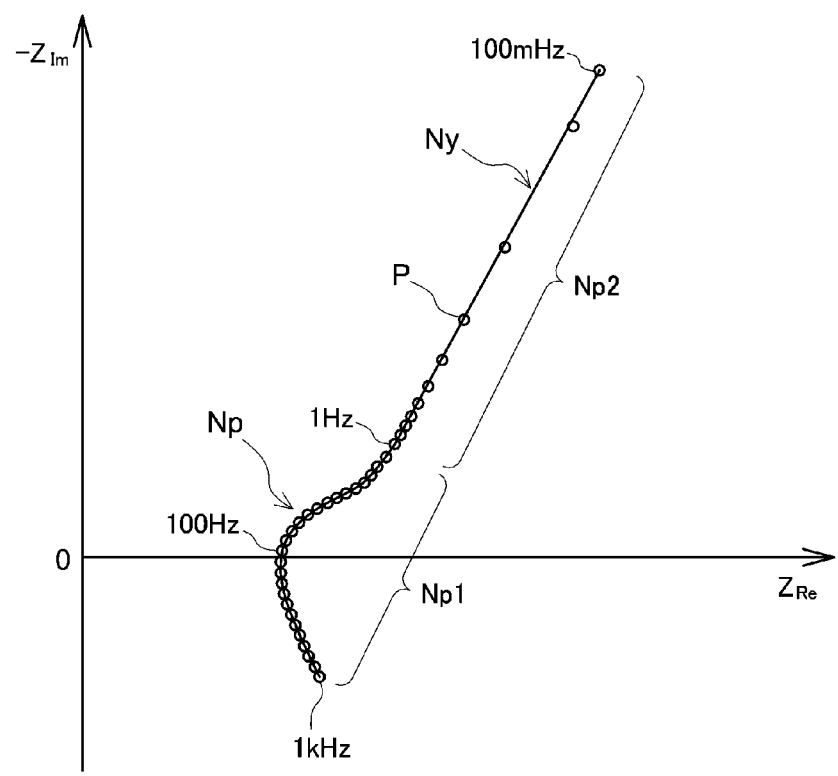
FIG. 2 is a graph illustrating an example of Nyquist plot for a plurality of modules M.

FIG. 2 is a graph illustrating an example of Nyquist plot Np for a plurality of modules M.

The horizontal axis in FIG. 2 represents the real component ($Z_{Re}$) of alternating current impedance (complex impedance) of module M. The vertical axis in FIG. 2 represents the imaginary component ($-Z_{Im}$) of alternating current impedance (complex impedance) of module M.

In the present embodiment, the measurement device 60 applies, for example, application signals having various frequencies in the range of 100 mHz to 1 kHz to the module M. Since the signals with various frequencies are applied to the module M, the measurement results of alternating current impedance of the module M corresponding to the frequencies are plotted on a complex plane as discrete values, as shown in FIG. 2. A set of plot points p that are obtained by the measurement as described above is referred to as a "Nyquist plot Np".

As illustrated in FIG. 2, application signals with 52 different frequencies in the frequency range of 100 mHz to 1 kHz are used for the Nyquist plot Np. The acquired Nyquist plot Np includes a semi-circular portion Np1 in a substantially arc shape, which is obtained from application signals at high frequencies, and a linear portion Np2 in a substantially linear shape, which is obtained from application signals at low frequencies. Herein, in the example shown in FIG. 2, the boundary is approximately at 1 Hz, and the application signals having a frequency of 1 Hz to 1 kHz are classified as high frequency, which may form the semi-circular portion Np1. On the other hand, the application signals having a frequency of 100 mHz to 1 Hz are classified as low frequency, which may form the linear portion Np2. The application signal having a frequency of 1 Hz may be either high frequency or low frequency.

Nyquist Diagram Ny

The measurement device 60 is configured to obtain a Nyquist diagram Ny that follows the Nyquist plot Np by a predetermined method. In the present embodiment, the Nyquist diagram Ny is obtained by the fitting unit 66.

Equivalent Circuit

The fitting unit 66 is configured to obtain an equivalent circuit by analyzing the Nyquist plot Np obtained as the results of measurement. The measurement results are fitted to an equivalent circuit, whereby a Nyquist diagram Ny according to the Nyquist plot Np obtained as the results of measurement is obtained. Herein, reference is made to FIG. 2 as appropriate in describing the Nyquist plot Np and the Nyquist Diagram Ny.

For the fitting unit 66, an equivalent circuit may be determined in advance according to a secondary battery that is to be measured (the module M in the present embodiment), for example. In the fitting unit 66, an equivalent circuit that shows a frequency characteristic of the alternating current impedance of the module M may be constructed in advance, for example, based on the evaluation results or the simulation results for a large number of modules. In this case, the fitting unit 66 may be configured to vary the parameters of the elements in the equivalent circuit and fit the parameters to the Nyquist plot Np, so that a Nyquist diagram Ny can be obtained according to the Nyquist plot Np obtained as the results of the measurement.

An Example of Equivalent Circuit Model 80

Figure 3:
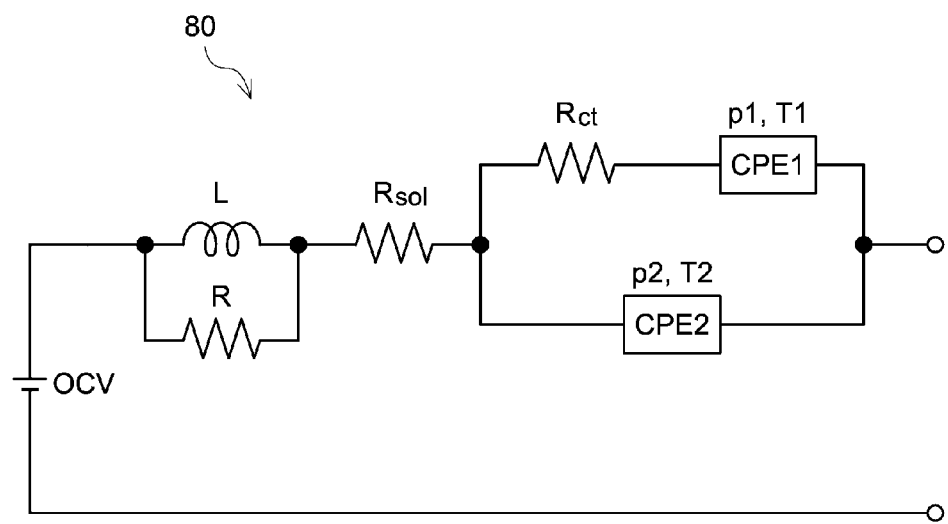
FIG. 3 is a circuit diagram illustrating an example of an equivalent circuit model 80.

FIG. 3 is a circuit diagram illustrating an example of an equivalent circuit model 80. As illustrated in FIG. 3, the equivalent circuit model 80 includes, as circuit parameters (model parameters), junction inductance L, junction resistance R, solution resistance Rsol, charge transfer resistance Rct, diffusion resistance (represented as CPE1), and electric double layer capacitance (represented as CPE2).

In the equivalent circuit model 80 shown here, the junction inductance L is an inductance component at a junction between cells (i.e., the junction between the positive electrode and the negative electrode) contained in the module M (see FIG. 1). The junction resistance R is a resistance component at the just-mentioned junction. The solution resistance Rsol is a resistance component of the electrolyte solution that exists between the positive electrode and the negative electrode. The charge transfer resistance Rct is a resistance component that relates to charge transfer (transmission and reception of charge) at the electrode/electrolyte interface (i.e., the surfaces of the positive electrode active material and the negative electrode active material). The diffusion resistance CPE1 is a resistance component that relates to diffusion of salt in the electrolyte solution or diffusion of charge transfer substance in the active material. The electric double layer capacitance CPE2 is a capacitance component of an electric double layer capacitance CPE2 that is formed at the electrode/electrolyte interface. It should be noted that each of the circuit parameters is one obtained by combining the corresponding components of all the cells in the module M.

The junction inductance L and the junction resistance R are connected in parallel with each other. The solution resistance Rsol is connected in series with the parallel circuit of the junction inductance L and the junction resistance R. The charge transfer resistance Rct and the diffusion resistance CPE1 are connected in series with each other. This series circuit of the charge transfer resistance Rct and the diffusion resistance CPE1 is connected in parallel with the electric double layer capacitance CPE2. The circuit including the junction inductance L, the junction resistance R, and the solution resistance Rsol is connected in series with the circuit including the charge transfer resistance Rct, the diffusion resistance CPE1, and the electric double layer capacitance CPE2.

Each of the diffusion resistance and the electric double layer capacitance in the module M is expressed by a nonlinear element called a constant phase element (CPE). Specifically, an impedance ZCPE1 corresponding to the diffusion resistance CPE1 can be expressed by the following Equation (1) using a CPE index p1 and a CPE constant T1. Note that in Equation (1), the angular frequency of the alternating current signal applied to the module (i.e., application signal) is represented by $\omega$ ($\omega=2\pi f$).

$$ZCPE1=1/\{(j\omega)p1 \times T1\} \qquad (1)$$

Likewise, an impedance ZCPE2 corresponding to the electric double layer capacitance CPE2 can be expressed by the following equation (2) using a CPE index p2 and a CPE constant T2.

$$ZCPE2=1/\{(j\omega)p2 \times T2\} \qquad (2)$$

Thus, the equivalent circuit model 80 shown in FIG. 3 includes the following eight circuit parameters: the junction inductance L, the junction resistance R, the solution resistance Rsol, the charge transfer resistance Rct, the CPE index p1, the CPE constant T1, the CPE index p2, and the CPE constant T2. The combined impedance of the module M is expressed by a predetermined expression that uses these eight circuit parameters (L, R, Rsol, Rct, p1, T1, p2, and T2) contained in the equivalent circuit model.

The fitting unit 66 performs a fitting process (curvilinear regression) of an impedance curve so that the impedance curve best fits the Nyquist plot Np obtained by the plotter 64. As the technique of the curvilinear regression, it is possible to use the nonlinear least squares method (LSQ), for example. Specifically, at each of the frequencies of the application signals, the fitting unit 66 calculates a coordinate that is plotted (measured) at the frequency and a coordinate on the impedance curve that corresponds to the frequency. Then, the square of the distance (i.e., error) between the coordinates is calculated for every frequency of the application signals. The calculated values are totaled. In other words, the sum of squared errors is calculated. Then, the eight circuit parameters (L, R, Rsol, Rct, p1, T1, p2, and T2) contained in the equivalent circuit model 80 are adjusted so that the sum of squares of the errors can be minimized. The fitting process using the nonlinear least squares method is repeated until a predetermined convergence condition is satisfied. The convergence condition herein may be specified as, for example, the time until a value indicating goodness of fit, such as a chi-square value, falls below a determination value. As a result, when the convergence condition is satisfied, a Nyquist diagram Ny as an impedance curve is determined.

FIG. 2 shows a Nyquist diagram Ny obtained by a fitting process for the results of the alternating current impedance measurement for the module M. The Nyquist diagram Ny is obtained as a line that approximately fits the Nyquist plot Np.

Although the present embodiment describes an example of the technique for obtaining an equivalent circuit and a Nyquist diagram Ny for the measurement device 60, the Nyquist diagram Ny may be obtained by a predetermined method based on a Nyquist plot obtained through an AC-IR measurement. For example, the above-described example illustrates the least squares method as a fitting algorithm for a predetermined equivalent circuit model 80. However, the fitting algorithm is not limited to the least squares method. For example, it is also possible that adjacent plot points in the Nyquist plot Np may be connected by a straight line. It is also possible to employ other algorithms, such as polynomials including quadratic polynomials and cubic polynomials, power approximation, and genetic algorithm (GA). In addition, the fitting unit 66 is not limited to the technique that utilizes the equivalent circuit model 80, and the fitting unit 66 may be configured to recognize the Nyquist plot Np obtained by an AC-IR measurement method using an image processing technology and to obtain a line that fits the Nyquist plot Np as a Nyquist diagram Ny by a predetermined method.

The present inventors intend to estimate battery capacity accurately and efficiently. In investigating techniques to accomplish the purpose, the present inventors have conceived an idea of obtaining a battery capacity by building a pre-trained neural network model, while paying special attention to the fact that there is a correlation between Nyquist plot Np and battery capacity. Furthermore, in order to improve the accuracy of the battery capacity, the present inventors have conceived of an idea of obtaining a battery capacity estimate value by building a pre-trained neural network model using the image data of a Nyquist diagram Ny as the input data so as to obtain the battery capacity estimate value from the image data of the Nyquist diagram Ny.

Image Data of Nyquist Diagram Ny

Herein, the image data of the Nyquist diagram Ny may be image data in which the Nyquist diagram Ny is extracted from the image data of FIG. 2. For example, the image data of the Nyquist diagram Ny may be such image data of the Nyquist diagram Ny of FIG. 2 from which unnecessary information such as the plot points p of the Nyquist plot Np are eliminated and in which only the vertical axis, the horizontal axis, and the Nyquist diagram Ny are left. It should be noted that the image data of the Nyquist diagram Ny may include information other than the Nyquist diagram Ny. For example, the image data of the Nyquist diagram Ny may also contain plot points p of the Nyquist plot Np. The image data of the Nyquist diagram Ny may be image data that contain the Nyquist diagram Ny as illustrated in FIG. 2, and may be image data from which the Nyquist diagram Ny can be extracted by predetermined image processing performed by a computer. It is also possible that coordinate data of the Nyquist diagram Ny may be added to the image data of the Nyquist diagram Ny.

The image data of the Nyquist diagram Ny can be created by image processing according to a prestored predetermined program executed by a computer. The image processing by a computer can be implemented using image processing software. The image processing may be programmed to create the image data of the Nyquist diagram Ny from an AC-IR measurement and the data produced by processing the measurement values of the AC-IR measurement, such as a Nyquist plot Np, an equivalent circuit model 80 (see FIG. 3), or a Nyquist diagram Ny. The image data of the Nyquist diagram Ny may be processed so that the width, color, or the like of the line of the Nyquist diagram Ny is modified. The width of the line of the Nyquist diagram Ny may be set to an appropriate width so that, for example, measurement errors of the Nyquist plot Np can be included in the line of the Nyquist diagram Ny. When the color of the Nyquist diagram Ny is set to be a predetermined specific color, the line of the Nyquist diagram Ny is recognized more easily in the image processing by a computer. This can improve the accuracy of the image processing that uses the image data of the Nyquist diagram Ny.

Figure 4:
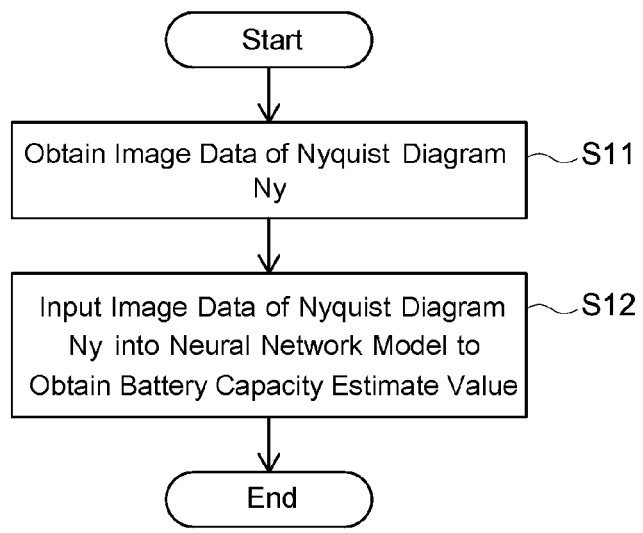
FIG. 4 is a flow-chart illustrating a battery capacity estimation method according to the present disclosure.

FIG. 4 is a flow-chart illustrating a battery capacity estimation method according to the present disclosure. As illustrated in FIG. 4, an embodiment of the battery capacity estimation method disclosed herein includes a first step (S11) and a second step (S12).

The first step (S11) is a step of obtaining image data of a Nyquist diagram drawn by a predetermined method, based on a Nyquist plot obtained by a predetermined AC-IR measurement.

The second step (S12) is a step of obtaining a battery capacity estimate value of a battery to be measured, by inputting the image data of the Nyquist diagram obtained in the first step (S11) into a pre-trained neural network model.

According to the just-described battery capacity estimation method, image data of the Nyquist diagram Ny obtained by an AC-IR measurement are input to a pre-trained neural network model 20, to obtain an estimate value of battery capacity. In the Nyquist diagram Ny, the plot points of the Nyquist plot Np obtained by the AC-IR measurement are interpolated. For this reason, the Nyquist diagram Ny contains a greater amount of information than the Nyquist plot Np. The AC-IR measurement, the analysis for obtaining a Nyquist diagram Ny, and the process of obtaining an estimate value of battery capacity can be carried out in a relatively short time. For this reason, the battery capacity can be estimated efficiently and accurately. Thus, by estimating a battery capacity with a pre-trained neural network model 20 using the image data of the Nyquist diagram Ny as the input data, both efficiency and accuracy are improved in estimating the battery capacity.

Figure 5:
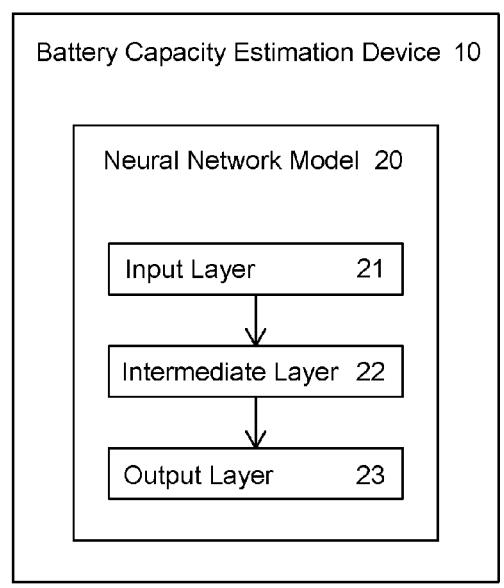
FIG. 5 is a configuration diagram illustrating a battery capacity estimation device 10.

Next, an embodiment of the battery capacity estimation device that implements such a battery capacity estimation method will be described below. FIG. 5 is a configuration diagram illustrating a battery capacity estimation device 10.

As illustrated in FIG. 5, the battery capacity estimation device 10 includes a neural network model 20, which includes an input layer 21, an intermediate layer 22, and an output layer 23.

Herein, the input layer 21 is configured to receive image data of a Nyquist diagram of a battery to be measured.

The intermediate layer 22 is configured to perform a computation based on the image data input to the input layer 21, to obtain an estimate value of battery capacity.

The output layer is configured to output the battery capacity estimate value obtained by the intermediate layer 22.

With the above-described battery capacity estimation device 10, image data of a Nyquist plot Np obtained by an AC-IR measurement are input to obtain an estimate value of battery capacity. For this reason, the battery capacity can be estimated efficiently and accurately.

The pre-trained neural network model 20 may be configured to learn, for a battery to be measured, training data including the image data of the Nyquist diagram Ny and an assessment value of battery capacity that are associated with each other, to thereby obtain a battery capacity estimate value based on the image data that are input to the input layer 21. The assessment value of battery capacity in the training data may be, for example, an actual measurement value of battery capacity of the battery that was measured when the image data of the Nyquist diagram Ny were obtained.

The assessment value of battery capacity obtained by the intermediate layer 22 of the pre-trained neural network model 20 may be, for example, a battery capacity of the battery to be measured that is in a predetermined state of charge. The intermediate layer 22 of the pre-trained neural network model 20 may output, for example, a battery capacity of the battery to be measured that is in a fully charged state (100% SOC). It is also possible to obtain a battery capacity of the battery to be measured that is in a state of charge at 80% SOC. Thus, the assessment value of battery capacity that is output from the intermediate layer 22 may be a value obtained by assessing the battery capacity of a battery to be measured that is in any state of charge.

Similarly, regarding the battery capacity estimate value, it is also possible to construct the pre-trained neural network model 20 so as to output a battery capacity of the battery to be measured that is in a predetermined state of charge. Additionally, regarding the battery capacity estimate value, it is also possible to construct the pre-trained neural network model 20 so as to obtain a plurality of battery capacities of the battery to be measured that is in a plurality of predetermined states of charge. In this case, the battery capacity estimate value obtained as a processing result by the intermediate layer 22 of the pre-trained neural network model 20 may be a battery capacity of the battery to be measured at a fully charged state (100% SOC), a battery capacity thereof at 80% SOC, or a battery capacity thereof at 60% SOC.

Herein, although not shown in the drawings, the intermediate layer 22 of the neural network model 20 may include, for example, a plurality of artificial neurons. Each of the artificial neurons includes at least one weighting factor indicating the strength of a connection between artificial neurons. The intermediate layer 22 is configured to perform a computation based on the weighting factor to obtain a battery capacity estimate value from the image data of the Nyquist diagram Ny that are input to the input layer 21 of the neural network model 20. The weighting factor may be determined by, for a battery to be measured (i.e., module M: see FIG. 1), learning training data in which image data of the Nyquist diagram Ny obtained by an AC-IR measurement are associated with an assessment value of battery capacity. The intermediate layer 22 may include a plurality of so-called hidden layers each including a plurality of artificial neurons.

Herein, the learning method for the neural network model 20 is not limited to any particular learning method. For example, it is possible to employ various types of learning methods for the neural network model 20, as appropriate, such as deep learning and various types of machine learning based on supervised training data.

Herein, the Nyquist diagram in the image data contained in the training data may be drawn to be sufficiently wide to contain the tolerance of the measurement values obtained by the AC-IR measurement method.

In this case, because the Nyquist diagram Ny is drawn to be sufficiently wide to contain the tolerance of the Nyquist plot Np, the Nyquist diagram Ny is allowed to contain true values of the Nyquist plot Np. The image data of the Nyquist diagram Ny drawn to be sufficiently wide to contain the tolerance of the measurement values may be used for the training data for the pre-trained neural network model 20. This improves the accuracy in estimation of battery capacity that is obtained by the intermediate layer 22 of the pre-trained neural network model 20.

The Nyquist diagram in the input data that are input to the input layer 21 of the pre-trained neural network model 20 may be drawn to be sufficiently wide to contain the tolerance of the Nyquist plot obtained by the AC-IR measurement. In other words, the Nyquist diagram in the image data obtained in the first step may be drawn to be sufficiently wide to contain the tolerance of the measurement values obtained by the AC-IR measurement method. This means that the Nyquist diagram obtained from the input data that are input to the input layer 21 of the pre-trained neural network model 20 contains true values of the Nyquist plot Np. This improves the accuracy in estimation of battery capacity that is obtained by the intermediate layer 22.

It should be noted that, if the width of the Nyquist diagram resulting from the image data contained in the training data for constructing the neural network model 20 is too wide, it means that the training data inevitably contain many errors. For this reason, the Nyquist diagram in the image data contained in the training data may be drawn to have a width less than or equal to two times (for example, less than or equal to 1.5 times) the tolerance of the Nyquist plot. This serves to reduce the errors contained in the training data, thus improving the accuracy in estimation of battery capacity that is obtained by the intermediate layer 22 of the pre-trained neural network model 20.

Moreover, the Nyquist diagram in the image data that are input to the input layer 21 of the pre-trained neural network model 20 may also be drawn to have a width less than or equal to two times (for example, less than or equal to 1.5 times) the tolerance of the Nyquist plot. This serves to reduce the errors contained in the input data as well. As a result, the accuracy in estimation of battery capacity is improved.

Thus, the accuracy in estimation of capacity is further improved by optimizing the width of the Nyquist diagram in the training data and the input data for the pre-trained neural network model 20. Herein, the width of the Nyquist diagram may be determined by setting the width of a line that draws the Nyquist diagram when obtaining the image data of the Nyquist diagram.

The battery capacity estimation method and the battery capacity estimation device 10 disclosed herein may be suitably applied to, for example, a method of and a device for estimating the battery capacity of a battery pack recovered from a vehicle.

A battery pack recovered from a vehicle is disassembled into modules, and thereafter, each of the modules is subjected to performance assessment. As a result of the performance assessment, the modules that are determined to be reusable are reused (rebuilt) as a part of a newly manufactured battery pack. However, depending on the structure of the battery pack, it is also possible to carry out the performance evaluation in the shape of battery pack without disassembling the battery pack. Furthermore, it is also possible to carry out the performance evaluation for each of the battery cells that make up the module.

In the present embodiment, the secondary battery cell (each of the battery cells that make up the module) is a nickel-metal hydride battery. Specifically, the positive electrode includes nickel hydroxide [$Ni(OH)_2$] containing a cobalt oxide additive. The negative electrode includes a hydrogen-absorbing alloy ($MnNi_5$-based alloy, which is a nickel-based alloy). The electrolyte solution includes potassium hydroxide (KOH). However, this is merely an illustrative example of specific cell structure, and it is possible to apply the technique illustrated in the present disclosure to various other types of secondary batteries.

Battery Logistics Model

Figure 6:
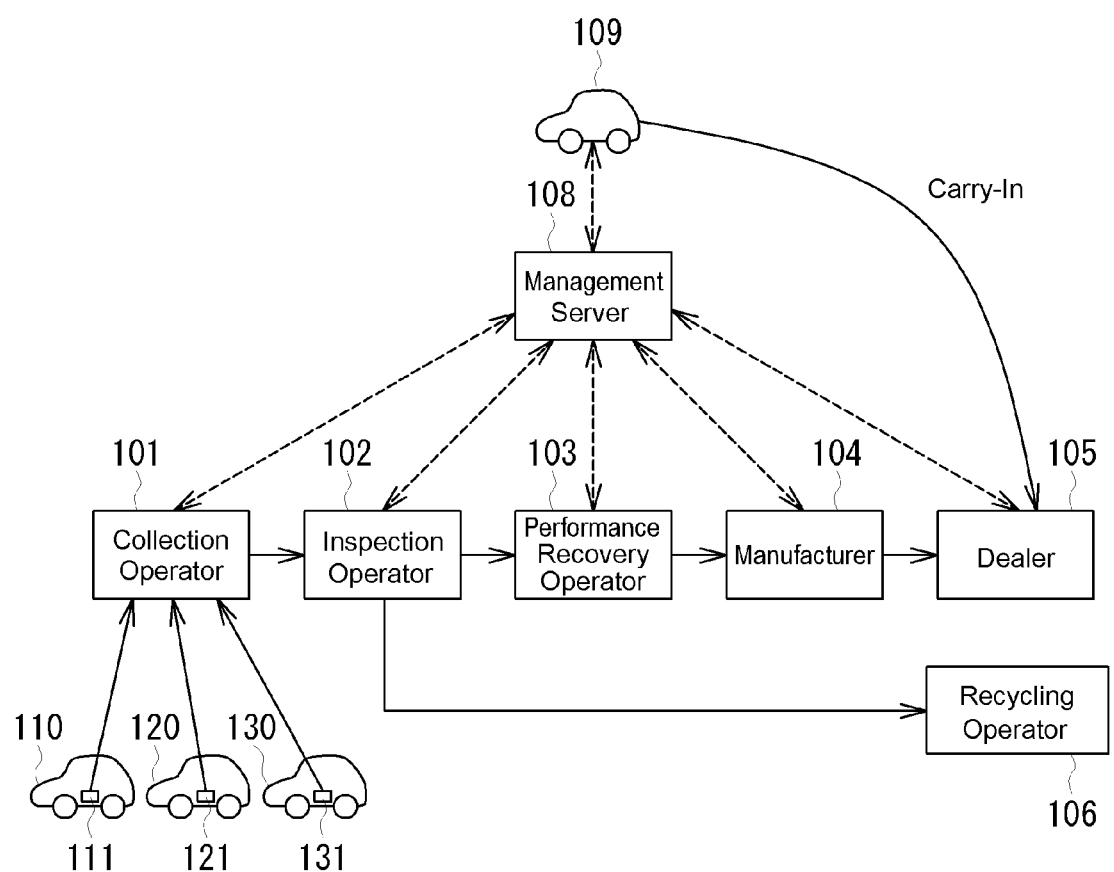
FIG. 6 is a schematic view illustrating a logistics model of secondary batteries, including collection, manufacturing (recycling), and sales of the batteries.

FIG. 6 is a schematic view illustrating a logistics model of secondary batteries, including collection, manufacturing (recycling), and sales of the batteries. In the example shown in FIG. 6, a collection operator 101 collects used secondary batteries (battery packs) 111, 121, and 131 from vehicles 110, 120, and 130. Although only three vehicles 110, 120, and 130 are illustrated in FIG. 6, secondary batteries are collected from a greater number of vehicles in a real situation. The collection operator 101 disassembles the collected battery packs to obtain a plurality of modules from each of the battery packs. In the example shown in FIG. 6, an identification number is assigned to each of the modules, and the information about each of the modules is managed by a management server 108. The collection operator 101 transmits the identification numbers of the modules obtained from the battery packs to the management server 108 using a terminal device (not shown).

An inspection operator 102 carries out performance assessment for each of the modules collected by the collection operator 101. For example, the inspection operator 102 assesses at least one electrical characteristic of each of the modules, including the battery capacity (for example, fully charged capacity), the resistance value, the open circuit voltage (OCV), and the state of charge (SOC) of each of the modules. The inspection operator 102 determines a plan for reusing the modules based on the results of the assessment. For example, the inspection operator 102 separates the modules into reusable modules and non-reusable modules based on the results of the assessment, and hands over the reusable modules to a performance recovery operator 103 and the non-reusable modules to a recycling operator 106. The results of the performance assessment for each of the modules is transmitted to a management server 108 by a terminal (not shown) of the inspection operator 102.

The performance recovery operator 103 carries out a process for recovering the performance of the modules that have been determined as reusable by the inspection operator 102. In an example, the performance recovery operator 103 charges the modules to an overcharged state so as to recover the fully charged capacity of the modules. However, it is possible that the performance recovery process by the performance recovery operator 103 may be eliminated for the modules that have been assessed to have low performance degradation in the performance assessment by the inspection operator 102. The results of the performance recovery for each of the modules is transmitted to the management server 108 by a terminal (not shown) of the performance recovery operator 103.

A manufacturer 104 manufactures battery packs using the modules of which the performance recovery operator 103 have recovered the performance. For example, the manufacturer 104 may replace a module showing degraded performance in a battery pack of a vehicle 109 with a module of which the performance recovery operator 103 have recovered the performance, to manufacture (rebuild) the battery pack of the vehicle 109.

A dealer 105 may sell the battery packs manufactured by the manufacturer 104 as battery packs for vehicle use or as battery packs for stationary use that may be usable in residential settings. A recycling operator 106 disassembles the modules that have been determined as non-reusable by the inspection operator 102, and recycles the modules for using them as a material for new battery cells or the like.

Note that FIG. 6 depicts the collection operator 101, the inspection operator 102, the performance collection operator 103, the manufacturer 104, the dealer 105, and the recycling operator 106 as different business entities. However, the types of business entities are not limited to the examples shown in FIG. 1. For example, the inspection operator 102 and the performance recovery operator 103 may be the same business entity. Also, the collection operator 101 may be fulfilled by two separate operators, one that collects battery packs and the other that disassembles the collected battery packs. The base locations of the operators and dealers are not limited to specific locations, and a plurality of operators are based at either the same location or different locations. It should be noted that FIG. 6 merely illustrates an embodiment to which the battery capacity estimation method and the battery capacity estimation device disclosed herein may be applied, and the battery capacity estimation method and the battery capacity estimation device may be applied to various other methods and devices in which a battery capacity is estimated in a variety of situations.

Various embodiments of the battery capacity estimation method and the battery capacity estimation device have been described hereinabove according to the present disclosure. Unless specifically stated otherwise, the embodiments of the battery capacity estimation method and the battery capacity estimation device described herein do not limit the scope of the present invention. It should be noted that various other modifications and alterations may be possible in the embodiments of the battery capacity estimation method and the battery capacity estimation device disclosed herein. In addition, the features, structures, or steps described herein may be omitted as appropriate, or may be combined in any suitable combinations, unless specifically stated otherwise.

What is claimed is:

1. A battery capacity estimation method comprising:
   a first step of obtaining image data of a Nyquist diagram drawn by a predetermined method, based on a Nyquist plot obtained by a predetermined AC-IR measurement; and
   a second step of obtaining a battery capacity estimate value of a battery to be measured, by inputting the image data of the Nyquist diagram obtained in the first step into a pre-trained neural network model, wherein:
   the neural network model comprises:
   an input layer configured to receive the image data of the Nyquist diagram of the battery to be measured;
   an intermediate layer configured to obtain a battery capacity estimate value according to the image data input to the input layer; and an output layer configured to output the battery capacity estimate value obtained by the intermediate layer.

2. The method according to claim 1, wherein:
the intermediate layer includes a plurality of artificial neurons, each of the artificial neurons including at least one weighting factor indicating a strength of a connection between artificial neurons, and the intermediate layer is configured to perform a computation based on the weighting factor to obtain the battery capacity estimate value from the image data of the Nyquist diagram that are input to the input layer of the neural network model; and
the weighting factor is determined by, for the battery to be measured, learning training data including the image data of the Nyquist diagram drawn by the predetermined method based on the Nyquist plot obtained by the AC-IR measurement and an assessment value of battery capacity that is obtained when the image data of the Nyquist diagram is obtained, the image data and the assessment value being associated with each other.

3. The method according to claim 2, wherein the Nyquist diagram in the image data contained in the training data is drawn to be sufficiently wide to contain the tolerance of the Nyquist plot obtained by the AC-IR measurement.

4. The method according to claim 3, wherein the Nyquist diagram in the image data contained in the training data is drawn to have a width less than or equal to two times the tolerance of the Nyquist plot obtained by the AC-IR measurement.

5. The method according to claim 1, wherein the Nyquist diagram in the image data obtained in the first step is drawn to be sufficiently wide to contain the tolerance of the Nyquist plot obtained by the AC-IR measurement.

6. The method according to claim 5, wherein the Nyquist diagram in the image data obtained in the first step is drawn to have a width less than or equal to two times the tolerance of the Nyquist plot obtained by the AC-IR measurement.

7. A battery capacity estimation device comprising:
an input layer configured to receive image data of a Nyquist diagram of a battery to be measured;
an intermediate layer configured to obtain a battery capacity estimate value by performing a computation based on a weighting factor of a pre-trained neural network model based on the image data input to the input layer; and
an output layer configured to output the battery capacity estimate value obtained by the intermediate layer.

8. The battery capacity estimation device according to claim 7, wherein:
the intermediate layer includes a plurality of artificial neurons, each of the artificial neurons including at least one weighting factor indicating a strength of a connection between artificial neurons, and the intermediate layer is configured to perform a computation based on the weighting factor to obtain the battery capacity estimate value from the image data of the Nyquist diagram that are input to the input layer of the neural network model; and
the weighting factor is determined by, for the battery to be measured, learning training data including the image data of the Nyquist diagram drawn by the predetermined method based on the Nyquist plot obtained by the AC-IR measurement and an assessment value of battery capacity that is obtained when the image data of the Nyquist diagram is obtained, the image data and the assessment value being associated with each other.

9. The battery capacity estimation device according to claim 8, wherein the Nyquist diagram in the image data contained in the training data is drawn to be sufficiently wide to contain the tolerance of the Nyquist plot obtained by the AC-IR measurement.

10. The battery capacity estimation device according to claim 9, wherein the Nyquist diagram in the image data contained in the training data is drawn to have a width less than or equal to two times the tolerance of the Nyquist plot obtained by the AC-IR measurement.

* * * * *